(12) United States Patent
Wei et al.

(10) Patent No.: US 12,308,739 B2
(45) Date of Patent: May 20, 2025

(54) FEEDBACK CONTROL CIRCUIT OF PULSE-FREQUENCY MODULATION CONVERTER THAT ADAPTIVELY ADJUSTS PEAK INDUCTOR CURRENT VALUE ACCORDING TO PULSE INTERVAL AND ASSOCIATED FEEDBACK CONTROL METHOD

(71) Applicant: Airoha Technology Corp., Hsinchu (TW)

(72) Inventors: Jui-Hung Wei, Hsinchu (TW);
Han-Chi Chiu, Hsinchu (TW);
En-Yang Lin, Miaoli County (TW);
John-San Yang, Hsinchu County (TW)

(73) Assignee: Airoha Technology Corp., Hsinchu (TW)

( * ) Notice: Subject to any disclaimer, the term of this patent is extended or adjusted under 35 U.S.C. 154(b) by 253 days.

(21) Appl. No.: 18/139,953

(22) Filed: Apr. 27, 2023

(65) Prior Publication Data

US 2023/0396163 A1 Dec. 7, 2023

Related U.S. Application Data

(60) Provisional application No. 63/349,599, filed on Jun. 7, 2022.

(51) Int. Cl.
*H02M 3/158* (2006.01)
*H02M 1/44* (2007.01)
*H02M 3/155* (2006.01)
*H02M 1/00* (2006.01)
*H02M 3/157* (2006.01)
(Continued)

(52) U.S. Cl.
CPC ............. *H02M 3/155* (2013.01); *H02M 1/44* (2013.01); *H02M 3/158* (2013.01); *H02M 1/0003* (2021.05); *H02M 3/157* (2013.01); *H03K 3/037* (2013.01); *H03K 5/1532* (2013.01)

(58) Field of Classification Search
CPC ........ H02M 1/003; H02M 1/44; H02M 3/155; H02M 3/156; H02M 3/157; H02M 3/158; H03K 3/037; H03K 5/1532
See application file for complete search history.

(56) References Cited

U.S. PATENT DOCUMENTS 9,960,680 B1 5/2018 Miyamae
10,122,265 B1 * 11/2018 Matthew ................. H02M 1/44
(Continued)

FOREIGN PATENT DOCUMENTS

TW 202101909 A 1/2021

*Primary Examiner* — Gary L Laxton
(74) *Attorney, Agent, or Firm* — Winston Hsu

(57) ABSTRACT

A feedback control circuit of a pulse-frequency modulation (PFM) converter includes a multiplexer circuit and a detection circuit. The multiplexer circuit is arranged to receive a plurality of candidate peak current values, and output one of the plurality of candidate peak current values as a target peak current value according to a selection control signal, wherein a peak current value of an inductor current pulse of the PFM converter is subject to the target peak current value. The detection circuit is arranged to adaptively adjust the selection control signal according to a pulse interval between two successive inductor current pulses of the PFM converter.

18 Claims, 10 Drawing Sheets

(51) Int. Cl.
  *H03K 3/037* (2006.01)
  *H03K 5/1532* (2006.01)

(56) References Cited

U.S. PATENT DOCUMENTS

| | | | |
|---|---|---|---|
| 2015/0062108 A1* | 3/2015 | Archibald | G06F 1/26 345/212 |
| 2015/0194880 A1* | 7/2015 | Wibben | H02M 3/156 323/282 |
| 2018/0091050 A1* | 3/2018 | Wakasugi | H03M 1/08 |
| 2021/0384826 A1 | 12/2021 | Karadi | |

* cited by examiner

FEEDBACK CONTROL CIRCUIT OF PULSE-FREQUENCY MODULATION CONVERTER THAT ADAPTIVELY ADJUSTS PEAK INDUCTOR CURRENT VALUE ACCORDING TO PULSE INTERVAL AND ASSOCIATED FEEDBACK CONTROL METHOD

CROSS REFERENCE TO RELATED APPLICATIONS

This application claims the benefit of U.S. Provisional Application No. 63/349,599, filed on Jun. 7, 2022. The content of the application is incorporated herein by reference.

BACKGROUND OF THE INVENTION

1. Field of the Invention

The present invention relates to a voltage converter design, and more particularly, to a feedback control circuit of a pulse-frequency modulation converter that adaptively adjusts a peak inductor current value according to a pulse interval and an associated feedback control method.

2. Description of the Prior Art

Switching direct current-direct current (DC-DC) voltage converters (regulators) are commonly used to provide a regulated voltage output derived from a power source such as a battery. One common type of switching voltage converter operates as a step down regulator (buck converter) that provides an output voltage which is lower than an input voltage. The pulse-frequency modulation (PFM) mode has a very simple structure in a DC-DC buck converter, and can save chip area. In addition, the PFM control can achieve high efficiency under light-load conditions. Generally speaking, the PFM control employs a pulse train to determine an output voltage of the DC-DC buck converter. For example, a typical PFM converter employs a constant peak inductor current value, and enables one inductor current pulse each time the output voltage drops below a reference voltage. However, instead of altering the duty cycle of the pulse train having a fixed frequency to set the output voltage, the PFM control alters the frequency of the pulse train. As a result, electromagnetic interference (EMI) noises may be introduced by the typical PFM converter due to the fact that the switching frequency of the typical PFM converter varies.

SUMMARY OF THE INVENTION

One of the objectives of the claimed invention is to provide a feedback control circuit of a pulse-frequency modulation converter that adaptively adjusts a peak inductor current value according to a pulse interval and an associated feedback control method.

According to a first aspect of the present invention, an exemplary feedback control circuit of a pulse-frequency modulation (PFM) converter is disclosed. The exemplary feedback control circuit includes a multiplexer circuit and a detection circuit. The multiplexer circuit is arranged to receive a plurality of candidate peak current values, and output one of the plurality of candidate peak current values as a target peak current value according to a selection control signal, wherein a peak current value of an inductor current pulse of the PFM converter is subject to the target peak current value. The detection circuit is arranged to adaptively adjust the selection control signal according to a pulse interval between two successive inductor current pulses of the PFM converter.

According to a second aspect of the present invention, an exemplary feedback control method employed by a pulse-frequency modulation (PFM) converter is disclosed. The exemplary feedback control method includes: performing a multiplexing operation upon a plurality of candidate peak current values according to a selection control signal, to output one of the plurality of candidate peak current values as a target peak current value, wherein a peak current value of an inductor current pulse of the PFM converter is subject to the target peak current value; and adaptively adjusting the selection control signal according to a pulse interval between two successive inductor current pulses of the PFM converter.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

For an audio application using the typical PFM converter with a constant peak inductor current value, it is possible that an audio band is interfered with the noise caused by the lower switching frequency of the typical PFM converter, and the power efficiency becomes poorer due to the higher switching frequency of the typical PFM converter. For example, when the load changes from a large value to a small value, the typical PFM converter with the constant peak inductor current value decreases its switching frequency automatically. However, when the switching frequency decreases to a frequency value within the audio band (e.g., 2 Hz to 22 KHz), the noise caused by the switching frequency becomes audible. For another example, when the load changes from a small value to a large value, the typical PFM converter with the constant peak inductor current value increases its switching frequency automatically. However, an increase of the switching frequency may lead to degradation of power efficiency. Thus, there is a need for an innovative PFM converter design which is capable of using an adaptive peak inductor current value to prevent an operating band of an application (e.g., an audio band of an audio application) from being interfered with the noise caused by switching frequency under a load decrease scenario and to improve the power efficiency under a load increase scenario. Further details of the proposed PFM converter design with an adaptive peak inductor current value are described as below with reference to the accompanying drawings.

Figure 1:
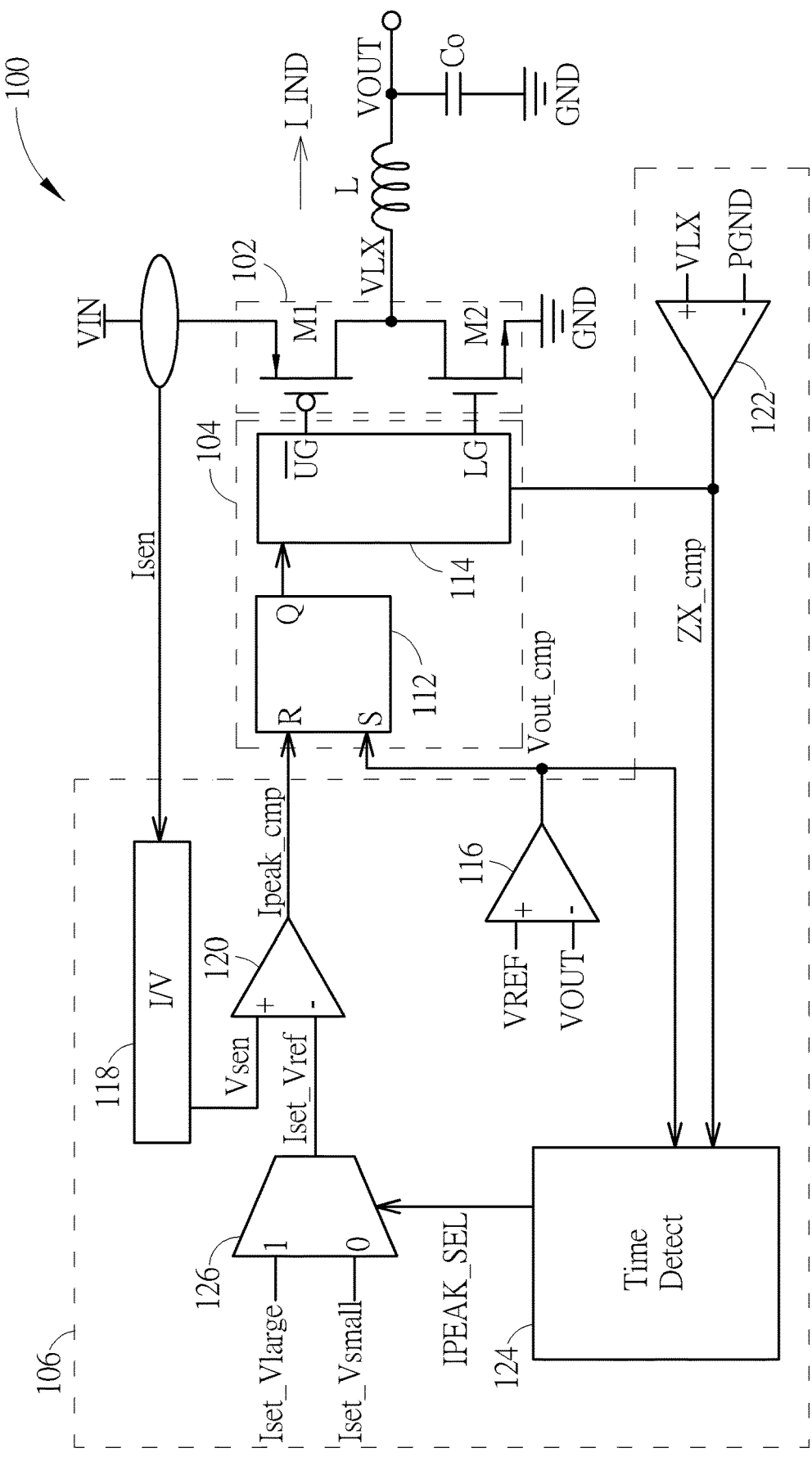
FIG. 1 is a diagram illustrating a first PFM converter according to an embodiment of the present invention.

FIG. 1 is a diagram illustrating a first PFM converter according to an embodiment of the present invention. The PFM converter 100 can be used as a DC-DC buck converter for regulating an output voltage VOUT according to an input voltage VIN (VOUT<VIN). By way of example, but not limitation, the PFM converter 100 may be used by an audio application, and the input voltage VIN may be supplied from a battery. The PFM converter 100 includes a power stage circuit 102, a PFM control circuit 104, a feedback control circuit 106, an inductor L, and an output capacitor Co. The power stage circuit 102 is coupled between the input voltage VIN and a reference voltage (e.g., ground voltage GND), and includes a high-side switch circuit and a low-side switch circuit. In this embodiment, the high-side switch circuit is implemented by a P-channel metal-oxide-semiconductor (PMOS) transistor M1, and the low-side switch circuit is implemented by an N-channel metal-oxide-semiconductor (NMOS) transistor M2. The PFM control circuit 104 is responsible for dealing with the PFM control. In this embodiment, the PFM control circuit 104 includes a set-reset (SR) latch circuit 112 and a switch control circuit 114. The SR latch circuit 112 includes a set input node (labeled by "S"), a reset input node (labeled by "R"), and an output node (labeled by "Q"). The operation of the SR latch circuit 112 may be represented by the following truth table, but the present invention is not limited thereto.

| S | R | Q |
|---|---|---|
| 0 | 0 | Q (Latch) |
| 0 | 1 | 0 |
| 1 | 0 | 1 |
| 1 | 1 | 0 |

The switch control circuit 114 sets the output signals $\overline{UG}$ and LG in response to an output signal of the SR latch circuit 112 or a feedback control signal ZX_cmp obtained from zero-crossing detection. The output signal $\overline{UG}$ is coupled to a gate terminal of the PMOS transistor M1, and the output signal LG is coupled to a gate terminal of the NMOS transistor M2. When the output node of the SR latch circuit 112 is set by a logic high level (i.e., Q=1), the switch control circuit 114 sets each of the output signals $\overline{UG}$ and LG by a logic low level (i.e., $\overline{UG}=\overline{Q}=0$ & LG=Q=0), such that the high-side switch circuit (PMOS transistor M1) is turned on, and the low-side switch circuit (NMOS transistor M2) is turned off. When the output node of the SR latch circuit 112 is reset by a logic low level (i.e., Q=0), the switch control circuit 114 sets each of the output signals $\overline{UG}$ and LG by a logic high level (i.e., $\overline{UG}=\overline{Q}=1$ & LG=Q=1), such that the high-side switch circuit (PMOS transistor M1) is turned off, and the low-side switch circuit (NMOS transistor M2) is turned on. Furthermore, when the feedback control signal ZX_cmp has a transition from the logic low level (i.e., ZX_cmp=0) to the logic high level (i.e., ZX_cmp=1), the output signal LG is reset by the logic low level (i.e., LG=0), where the output signal $\overline{UG}$ remains at the logic high level (i.e., $\overline{UG}=1$). Hence, the high-side switch circuit (PMOS transistor M1) and the low-side switch circuit (NMOS transistor M2) are both turned off.

The feedback control circuit 106 is arranged to generate a plurality of feedback control signals that are required by the PFM control circuit 104. In this embodiment, the feedback control circuit 106 includes a plurality of comparator circuits 116, 120, 122, a current-to-voltage converter circuit (labeled by "I/V") 118, a detection circuit (labeled by "Time Detect") 124, and a multiplexer circuit 126. A sensed current signal Isen that provides information on the inductor current I_IND ($I_{sen} \cong$ I_IND) flowing through the inductor L is converted into a sensed voltage signal Vsen by the current-to-voltage converter circuit 118. That is, the sensed voltage signal Vsen is indicative of the current value of the inductor current I_IND.

The comparator circuit 120 is arranged to compare the sensed voltage signal Vsen with a target peak current value Isen_vref (which is a voltage level indicative of a peak inductor current value), and generate and output a feedback control signal Ipeak_cmp to the reset input node (labeled by "R") of the SR latch circuit 112.

The comparator circuit 116 is arranged to compare the output voltage VOUT of the PFM converter 100 with a reference voltage VREF, and generate and output a feedback control signal Vout_cmp to the set input node (labeled by "S") of the SR latch circuit 112.

The comparator circuit 122 is arranged to compare a voltage VLX at a connection node between the high-side switch circuit (PMOS transistor M1) and the low-side switch circuit (NMOS transistor M2) of the power stage circuit 102 with a reference voltage (e.g., power-ground voltage PGND) for zero-crossing detection, and generate and output the feedback control signal ZX_cmp to the switch control circuit 114.

Figure 2:
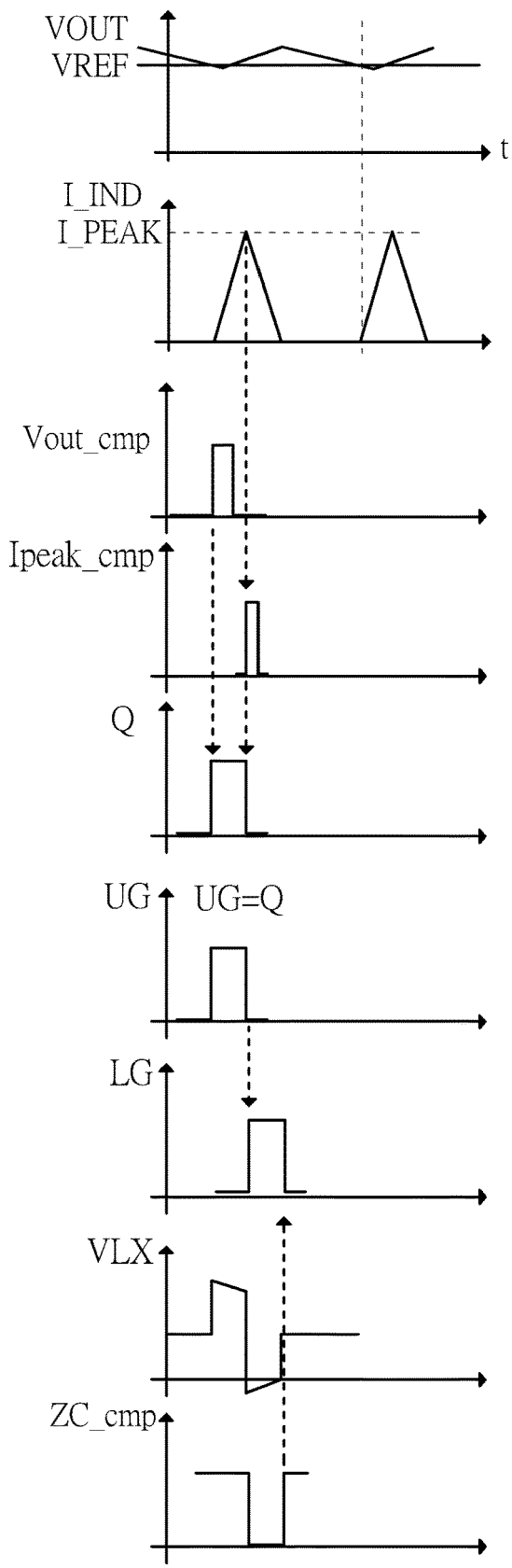
FIG. 2 is a diagram illustrating waveforms of different signals of the PFM converter shown in FIG. 1.

Please refer to FIG. 2 in conjunction with FIG. 1. FIG. 2 is a diagram illustrating waveforms of different signals of the PFM converter 100 shown in FIG. 1. The principle of the PFM control employed by the PFM converter 100 is described as below. When the output voltage VOUT drops below the reference voltage VREF, the feedback control signal Vout_cmp is set by the logic high level (i.e., Vout_cmp=1). Hence, the output node of the SR latch circuit 112 is set by the logic high level (i.e., Q=1) in response to the set input node of the SR latch circuit 112 being asserted (i.e., S=Vout_cmp=1). Since the output node of the SR latch circuit 112 is set by the logic high level (i.e., Q=1), the high-side switch circuit (PMOS transistor M1) is turned on, and the low-side switch circuit (NMOS transistor M2) is turned off. The inductor current I_IND increases due to the turned-on high-side switch circuit (PMOS transistor M1). In addition, the voltage VLX increases during a period in which the inductor current I_IND increases.

When the inductor current I_IND exceeds a peak inductor current value I_PEAK that makes the sensed voltage signal Vsen (which has a voltage representative of the inductor current I_IND) exceed the target peak current value Isen_vref (which is a voltage level indicative of the peak inductor current value I_PEAK), the feedback control signal Ipeak_cmp is set by the logic high level (i.e., Ipeak_cmp=1). Hence, the output node of the SR latch circuit 112 is reset by the logic low level (i.e., Q=0) in response to the reset input node of the SR latch circuit 112 being asserted (i.e., R=Ipeak_cmp=1). Since the output node of the SR latch circuit 112 is reset to the logic low level (i.e., Q=0), the high-side switch circuit (PMOS transistor M1) is turned off, and the low-side switch circuit (NMOS transistor M2) is turned on. The inductor current I_IND decreases due to the turned-on low-side switch circuit (NMOS transistor M2). At this moment, the voltage VLX becomes negative due to the fact that the inductor current I_IND should be continuous. Next, the voltage VLX increases during a period in which the inductor current I_IND decreases.

When the voltage VLX crosses over the power-ground voltage PGND, the feedback control signal ZX_cmp has a transition from the logic low level (i.e., ZX_cmp=0) to the logic high level (i.e., ZX_cmp=1), which in turn makes the switch control circuit 114 turn off the low-side switch circuit (NMOS transistor M2). Hence, both of the high-side switch circuit (PMOS transistor M1) and the low-side switch circuit (NMOS transistor M2) are turned off.

The major difference between the proposed PFM converter 100 and the typical PFM converter is that the proposed PFM converter 100 adopts an adaptive peak inductor current value. That is, the target peak current value Isen_vref fed into the comparator circuit 120 is not a fixed value. As shown in FIG. 1, the multiplexer circuit 126 is arranged to receive a plurality of candidate peak current values Iset_Vlarge and Iset_Vsmall, and output one of the candidate peak current values Iset_Vlarge and Iset_Vsmall as the target peak current value Iset_vref according to a selection control signal IPEAK_SEL. For example, when the selection control signal IPEAK_SEL is set by the logic high level (i.e., IPEAK_SEL=1), the multiplexing operation performed at the multiplexer circuit 126 outputs the candidate peak current value Iset_Vlarge as the target peak current value Iset_vref (i.e., Iset_vref=Iset_Vlarge); and when the selection control signal IPEAK_SEL is set by the logic low level (i.e., IPEAK_SEL=0), the multiplexing operation performed at the multiplexer circuit 126 outputs the candidate peak current value Iset_Vsmall as the target peak current value Iset_vref (i.e., Iset_vref=Iset_Vsmall), where the candidate peak current value Iset_Vlarge is larger than the candidate peak current value Iset_Vsmall.

Figure 3:
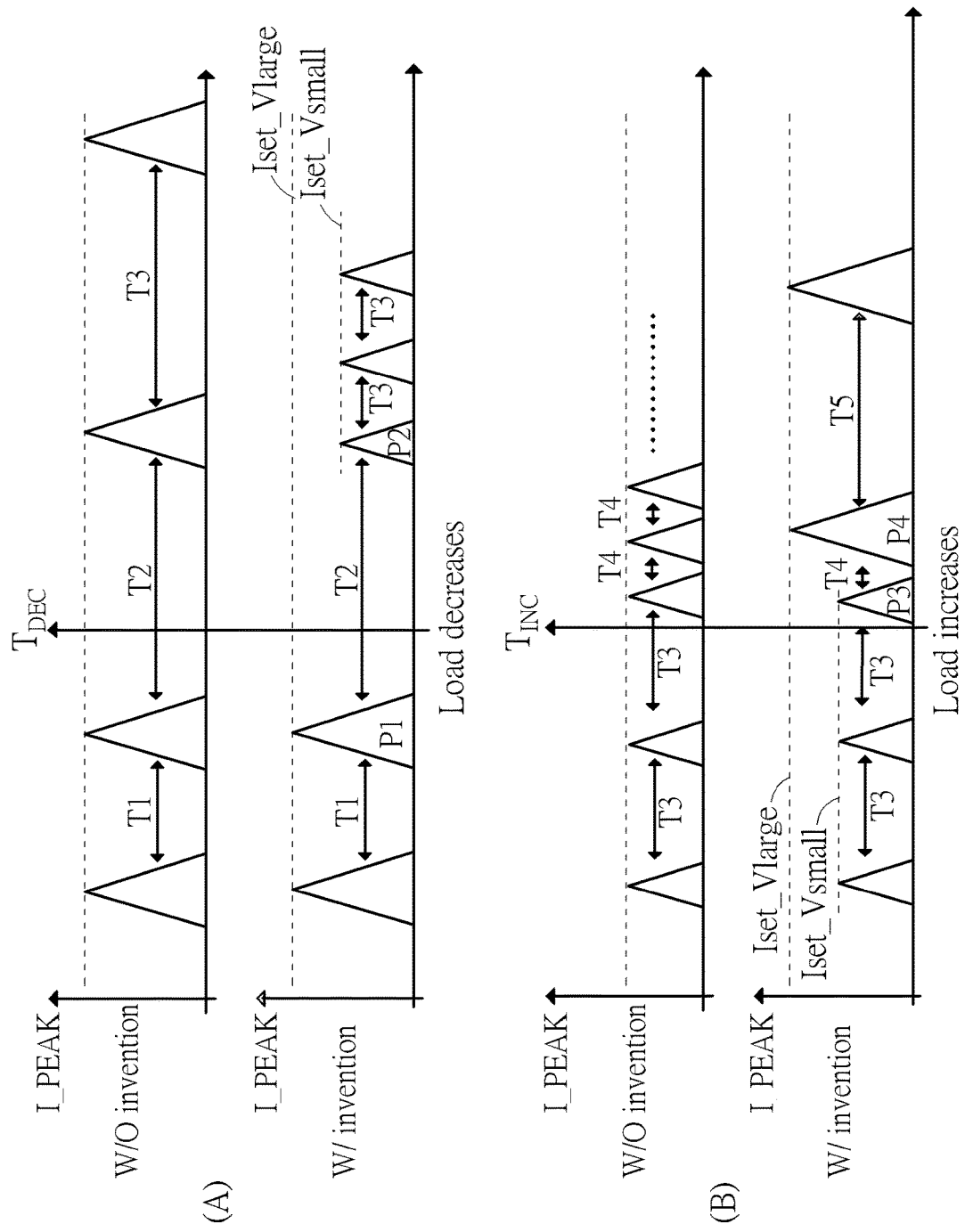
FIG. 3 is a diagram illustrating a concept of adaptively adjusting a peak inductor current value according to a pulse interval between two successive inductor current pulses.

In this embodiment, the detection circuit 124 is arranged to adaptively adjust the selection control signal IPEAK_SEL according to a pulse interval between two successive inductor current pulses (e.g., on-time pulses) of the PFM converter 100. FIG. 3 is a diagram illustrating a concept of adaptively adjusting a peak inductor current value according to a pulse interval between two successive inductor current pulses. The sub-diagram (A) of FIG. 3 shows a comparison between inductor current characteristics of the typical PFM converter without using the invention (top part) and inductor current characteristics of the proposed PFM converter 100 using the invention (bottom part) under a load decrease scenario. The sub-diagram (B) of FIG. 3 shows a comparison between inductor current characteristics of the typical PFM converter without using the invention (top part) and inductor current characteristics of the proposed PFM converter 100 using the invention (bottom part) under a load increase scenario.

As shown in the top part of sub-diagram (A) of FIG. 3, after the load decreases at the time point $T_{DEC}$, the typical PFM converter with a constant peak current value makes a switching period (i.e., a pulse interval between successive inductor current pulses) changed from a current value T1 to a larger value T2 (i.e., T2>T1), thereby reducing the switching frequency. As a result, it is possible that an audio band (e.g., 2 Hz to 22 KHz) is interfered with the noise caused by the lower switching frequency of the typical PFM converter. As shown in the bottom part of sub-diagram (A) of FIG. 3, after the load decreases at the time point $T_{DEC}$, the proposed PFM converter 100 with an adjustable peak current value makes a switching period (i.e., a pulse interval between successive inductor current pulses) changed from a current value T1 to a larger value T2 (i.e., T2>T1) for reducing the switching frequency, and further detects that the pulse interval T2 between two successive inductor current pulses (e.g., a previous inductor current pulse P1 and a current inductor current pulse P2) is longer than a pre-defined interval T_setDown (i.e., T2>T_setDown). Hence, the detection circuit 124 is operative to set the selection control signal IPEAK_SEL for instructing the multiplexer circuit 126 to output the candidate peak current value Iset_Vsmall as the target peak current value Iset_vref of the current inductor current pulse P2. After the target peak current value decreases, the proposed PFM converter 100 makes a switching period (i.e., pulse interval) changed from a current value T2 to a smaller value T3 (i.e., T3<T2) for increasing the switching frequency, thereby preventing the switching frequency of the PFM converter 100 from interfering with the audio band (e.g., 2 Hz to 22 KHz).

As shown in the top part of sub-diagram (B) of FIG. 3, after the load increases at the time point $T_{INC}$, the typical PFM converter with a constant peak current value makes a switching period (i.e., a pulse interval between successive inductor current pulses) changed from a current value T3 to a smaller value T4 (i.e., T4<T3) for increasing the switching frequency. As a result, the power efficiency becomes poorer due to the higher switching frequency of the typical PFM converter. As shown in the bottom part of sub-diagram (B) of FIG. 3, after the load increases at the time point TING, the proposed PFM converter 100 with an adjustable peak current value makes a switching period (i.e., a pulse interval between successive inductor current pulses) changed from a current value T3 to a shorter value T4 (T4<T3) for increasing the switching frequency, and further detects that the pulse interval T4 between two successive inductor current pulses (e.g., a previous inductor current pulse P3 and a current inductor current pulse P4) is shorter than another pre-defined interval T_setUp (i.e., T4<T_setUp). Hence, the detection circuit 124 is operative to set the selection control signal IPEAK_SEL for instructing the multiplexer circuit 126 to output the candidate peak current value Iset_Vlarge as the target peak current value Iset_vref of the current inductor current pulse P4. After the target peak current value increases, the proposed PFM converter 100 makes a switching period (i.e., pulse interval) changed from a current value T4 to a larger value T5 (i.e., T5>T4) for decreasing the switching frequency, thereby preventing degradation of power efficiency.

It should be noted that increasing the peak current value of the inductor current I_IND is equivalent to reducing the switching frequency of the power stage circuit 102, and decreasing the peak current value of the inductor current I_IND is equivalent to increasing the switching frequency of the power stage circuit 102. With the help of adaptively adjusting a peak inductor current value according to a pulse interval, the unwanted interference that interferes with an operating band of an application (e.g., an audio band of an audio application) can be prevented through using the proposed PFM converter 100 with the selection of a smaller peak inductor current value. In addition, degradation of power efficiency can be prevented through using the proposed PFM converter 100 with the selection of a larger peak inductor current value. Furthermore, the proposed PFM converter 100 with an adaptive peak inductor current value can meet efficiency requirements of different applications.

Figure 4:
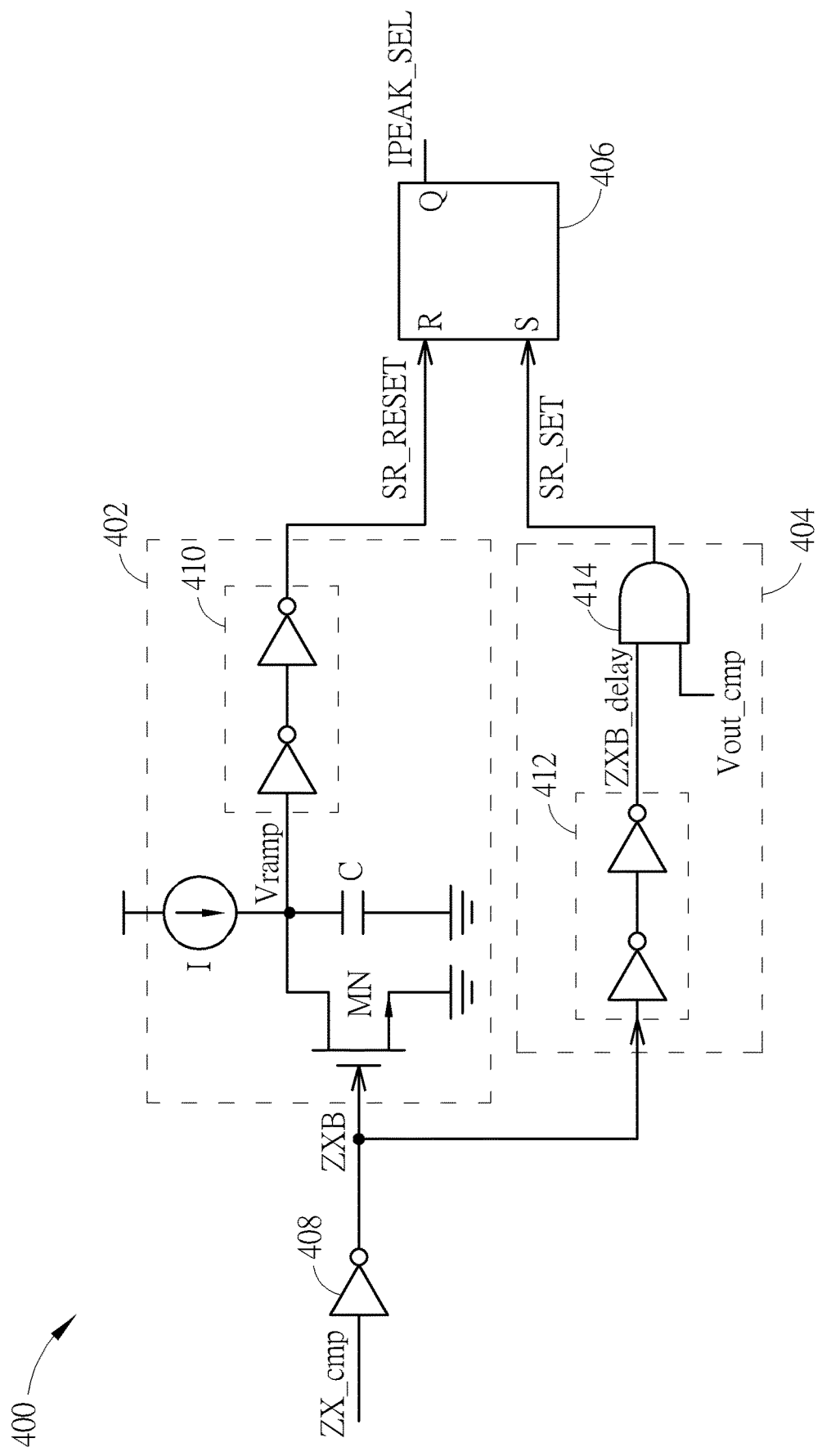
FIG. 4 is a diagram illustrating a first detection circuit design according to an embodiment of the present invention.

FIG. 4 is a diagram illustrating a first detection circuit design according to an embodiment of the present invention. The detection circuit 124 shown in FIG. 1 may be implemented by the detection circuit 400 shown in FIG. 4. In this embodiment, the detection circuit 400 includes a plurality of processing circuits 402 and 404, an SR latch circuit 406, and an inverter 408. The inverter 408 is arranged to receive the feedback control signal ZX_cmp (which is an output of the comparator circuit 122 that acts as a zero-crossing detector), and output an inverse of the feedback control signal ZX_cmp as an input signal ZXB of both of the processing circuits 402 and 404.

Figure 5:
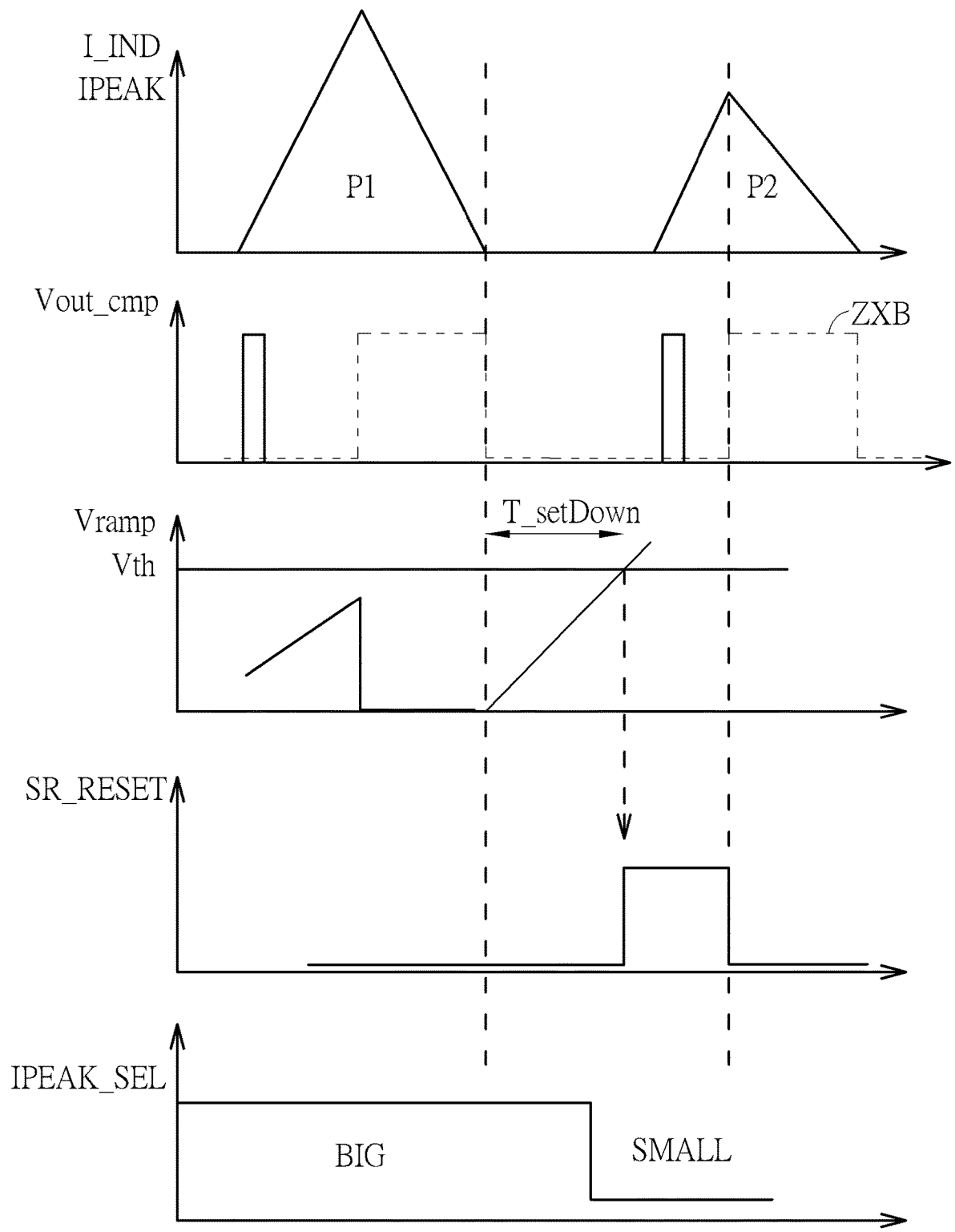
FIG. 5 is a diagram illustrating waveforms of different signals of one processing circuit shown in FIG. 4.

Regarding the processing circuit 402, it includes an NMOS transistor MN, a current source I, a capacitor C, and an inverter chain 410. The NMOS transistor MN has a gate terminal arranged to receive the input signal ZXB, a source terminal coupled to a reference voltage (e.g., GND), and a drain terminal. The current source I is coupled between a reference voltage (e.g., VIN) and the drain terminal of the NMOS transistor MN. The capacitor C is coupled between the drain terminal of the NMOS transistor MN and a reference voltage (e.g., GND). The inverter chain 410 includes an even number of inverters, and is arranged to generate a detection signal SR_RESET according to a drain voltage Vramp established at the drain terminal of the NMOS transistor MN. The processing circuit 402 is used to detect if a pulse interval between two successive inductor current pulses is longer than the pre-defined interval T_setDown. Please refer to FIG. 5 in conjunction with FIG. 3 and FIG. 4. FIG. 5 is a diagram illustrating waveforms of different signals of the processing circuit 402 shown in FIG. 4. Before the previous inductor current pulse P1 ends, the feedback control signal ZX_cmp has the logic low level (i.e., ZX_cmp=0) during a period in which the high-side switch circuit (PMOS transistor M1) is turned off and the low-side switch circuit (NMOS transistor M2) is turned on. Hence, the input signal ZXB has the logic high level (i.e., ZXB=1), which turns on the NMOS transistor MN for discharging the capacitor C to reset the drain voltage Vramp to an initial value (e.g., 0V). At the time the previous inductor current pulse P1 ends, the feedback control signal ZX_cmp has a transition from the logic low level (i.e., ZX_cmp=0) to the logic high value (i.e., ZX_cmp=1, ZXB=0), and the NMOS transistor MN is turned off for allowing the current source I to start charging the capacitor C. That is, the feedback control signal ZX_cmp is asserted (e.g., 0→1) at a time point being the end of one inductor current pulse (e.g., previous inductor current pulse P1 in this example). The pre-defined interval T_setDown is set based at least partly on charging time of the capacitor C. Specifically, with proper setting of the current source I and the capacitor C, the drain voltage Vramp reaches a threshold voltage Vth of a first inverter of the inverter chain 410 at the time the charging time of the capacitor C reaches the pre-defined interval T_setDown. Hence, when the charging time of the capacitor C reaches the pre-defined interval T_setDown, the inverter chain 410 makes the detection signal SR_RESET have the logic high level (i.e., SR_RESET=1), and output the detection signal SR_RESET to the reset input node (labeled by "R") of the SR latch circuit 406. It should be noted that the feedback control signal Vout_cmp (which is an output of the comparator circuit 116) is asserted (e.g., 0→1) at a time point being the start of one inductor current pulse (e.g., current inductor current pulse P2 in this example). Since the detection signal SR_SET is an AND gate output and the feedback control signal Vout_cmp is one AND gate input that is not asserted at this moment due to the fact that the current inductor current pulse P2 does not start yet, the detection signal SR_SET remains at the logic low level (i.e., SR_SET=0) at the time the detection signal SR_RESET has the logic high level (i.e., SR_RESET=1) in response to Vramp=Vth. In this way, the selection control signal IPEAK_SEL at the output node (labeled by "Q") of the SR latch circuit 406 has the logic low level (i.e., IPEAK_SEL=0) indicative of the selection of a small peak inductor current value (e.g., Iset_Vsmall).

The processing circuit 402 is used to detect if a pulse interval between two successive inductor current pulses is longer than the pre-defined interval T_setDown. In this embodiment, the pulse interval detection is enabled at the end of the previous inductor current pulse (which is also a time point at which the low-side switch circuit (NMOS transistor M2) is turned off due to assertion of the feedback control signal ZX_cmp). In addition, whether the pulse interval between the previous inductor current pulse and the current inductor current pulse is longer than the pre-defined interval T_setDown is determined based on the time point at which the low-side switch circuit (NMOS transistor M2) is turned off due to assertion of the previous feedback control signal ZX_cmp and the time point at which the high-side switch circuit (PMOS transistor M1) is turned on due to assertion of the current feedback control signal Vout_cmp. However, this is for illustrative purposes only, and is not meant to be a limitation of the present invention. Any means capable of detecting whether a pulse interval between successive inductor current pulses is longer than the pre-defined interval T_setDown may be adopted by the detection circuit 124.

Figure 6:
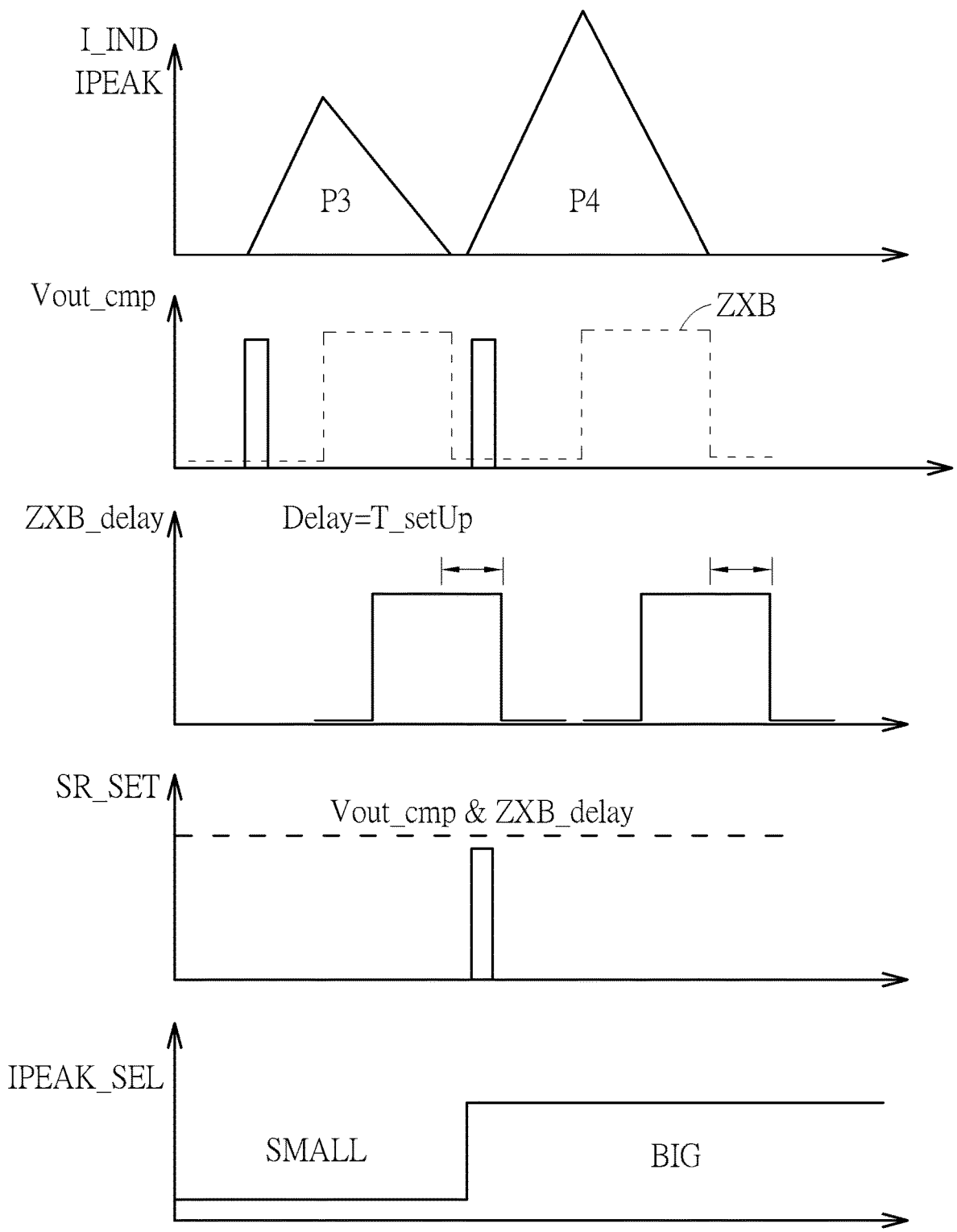
FIG. 6 is a diagram illustrating waveforms of different signals of the other processing circuit shown in FIG. 4.

Regarding the processing circuit 404, it includes an inverter chain 412 and an AND gate 414. The inverter chain 412 includes an even number of inverters, and is arranged to receive the input signal ZXB and apply a pre-defined delay to the input signal ZXB to generate a delayed input signal ZXB_delay. The AND gate 414 is arranged to receive the delayed input signal ZXB_delay and the feedback control signal Vout_cmp (which is an output of the comparator circuit 116), and perform an AND operation upon the delayed input signal ZXB_delay and the feedback control signal Vout_cmp to generate a detection signal SR_SET. The processing circuit 404 is used to detect if a pulse interval between two successive inductor current pulses is shorter than the pre-defined interval T_setUp. Please refer to FIG. 6 in conjunction with FIG. 3 and FIG. 4. FIG. 6 is a diagram illustrating waveforms of different signals of the processing circuit 404 shown in FIG. 4. Before the previous inductor current pulse P3 ends, the feedback control signal ZX_cmp has the logic low level (i.e., ZX_cmp=0) during a period in which the high-side switch circuit (PMOS transistor M1) is turned off and the low-side switch circuit (NMOS transistor M2) is turned on. Hence, the input signal ZXB has the logic high level (i.e., ZXB=1), which makes the delayed input signal ZXB_delay has the logic high level (i.e., ZXB). At the time the previous inductor current pulse P3 ends under the control of the switch control circuit 114, the feedback control signal ZX_cmp has a transition from the logic low level (i.e., ZX_cmp=0) to the logic high value (i.e., ZX_cmp=1), and the input signal ZXB has a transition from the logic high level (i.e., ZXB=1) to the logic low value (i.e., ZXB=0). The pre-defined interval T_setUp is set based at least partly on the pre-defined delay introduced by the inverter chain 412. Specifically, the delayed input signal ZXB_delay keeps the logic high level (i.e., ZXB_delay=1) during a period equal to the pre-defined delay (i.e., pre-defined interval T_setUp), and does not have a transition from the logic high level (i.e., ZXB_delay=1) to the logic low level (i.e., ZXB_delay=0) until the pre-defined interval T_setUp expires.

As mentioned above, the feedback control signal ZX_cmp is asserted (e.g., 0→1) at a time point being the end of one inductor current pulse (e.g., previous inductor current pulse P3 in this example), and the feedback control signal Vout_cmp (which is an output of the comparator circuit 116) is asserted (e.g., 0→1) at a time point being the start of one inductor current pulse (e.g., current inductor current pulse P4 in this example). After the feedback control signal ZX_cmp is asserted (e.g., 0→1), the delayed input signal ZXB_delay is not deasserted (e.g., 1→0) until the pre-defined interval T_setUp expires. Due to inherent characteristics of the AND gate 414, the detection signal SR_SET has the logic high level (i.e., SR_SET=1) under a condition of ZXB_delay=1 & Vout_cmp=1 only. Hence, the relationship between assertion timing of the current feedback control signal Vout_cmp and deassertion timing of the previous delayed input signal ZXB_delay decides the logic level at the AND gate output.

In a case where the feedback control signal Vout_cmp has a transition from the logic low level (i.e., Vout_cmp=0) to the logic high level (i.e., Vout_cmp=1) at a time point before the delayed input signal ZXB_delay has a transition from the logic high level (i.e., ZXB_delay=1) to the logic low level (i.e., ZXB_delay=0), it means that the feedback control signal Vout_cmp is asserted during the pre-defined delay (i.e., pre-defined interval T_setUp) since the end of the previous inductor current pulse P3, that is, the current inductor current pulse P4 starts before the pre-defined interval T_setUp expires. Since both of the feedback control signal Vout_cmp and the delayed input signal ZXB_delay have the same logic high level (i.e., ZXB_delay=1 & Vout_cmp=1), the detection signal SR_SET set by ANDing the feedback control signal Vout_cmp and the delayed input signal ZXB_delay has the logic high level (i.e., SR_SET=1). The AND gate 414 outputs the detection signal SR_SET to the set input node (labeled by "S") of the SR latch circuit 406. In this way, the selection control signal IPEAK_SEL at the output node (labeled by "Q") of the SR latch circuit 406 has the logic high level (i.e., IPEAK_SEL=1) indicative of the selection of a large peak inductor current value (e.g., Iset_Vlarge).

The processing circuit 404 is used to detect if a pulse interval between two successive inductor current pulses is shorter than the pre-defined interval T_setUp. In this embodiment, the pulse interval detection is enabled at the end of the previous inductor current pulse (which is also a time point at which the low-side switch circuit (NMOS transistor M2) is turned off due to assertion of the feedback control signal ZX_cmp). In addition, whether the pulse interval between the previous inductor current pulse and the current inductor current pulse is shorter than the pre-defined interval T_setUp is determined based on the time point at which the low-side switch circuit (NMOS transistor M2) is turned off due to assertion of the previous feedback control signal ZX_cmp and the time point at which the high-side switch circuit (PMOS transistor M1) is turned on due to assertion of the current feedback control signal Vout_cmp. However, this is for illustrative purposes only, and is not meant to be a limitation of the present invention. Any means capable of detecting whether a pulse interval between successive inductor current pulses is shorter than the pre-defined interval T_setUp may be adopted by the detection circuit 124.

The processing circuit 402 shown in FIG. 4 employs analog means to detect if a pulse interval between two successive inductor current pulses is longer than the pre-defined interval T_setDown. However, this is for illustrative purposes only, and is not meant to be a limitation of the present invention. Alternatively, digital means may be employed to achieve the same objective of detecting if a pulse interval between two successive inductor current pulses is longer than the pre-defined interval T_setDown.

Figure 7:
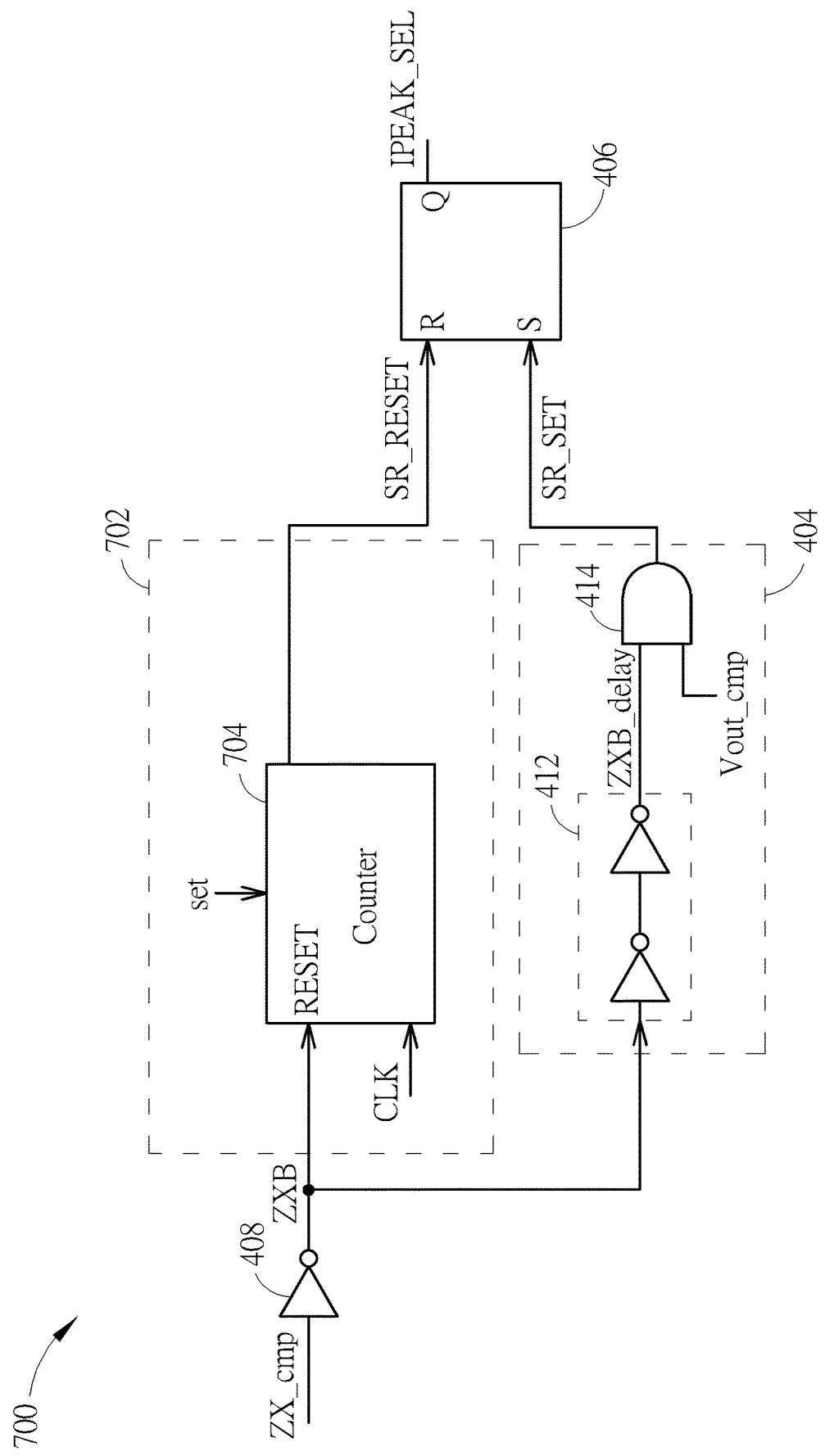
FIG. 7 is a diagram illustrating a second detection circuit design according to an embodiment of the present invention.

FIG. 7 is a diagram illustrating a second detection circuit design according to an embodiment of the present invention. The detection circuit 124 shown in FIG. 1 may be implemented by the detection circuit 700 shown in FIG. 7. The major difference between the detection circuits 400 and 700 is that the detection circuit 700 includes a processing circuit 702 that takes the place of the processing circuit 402 shown in FIG. 4. In this embodiment, the processing circuit 702 includes a counter circuit (labeled by "Counter") 704. The counter circuit 704 is arranged to count the number of cycles of a reference clock CLK (e.g., a high-frequency clock signal) to set the detection signal SR_RESET. The pre-defined interval T_setDown is set based at least partly on a pre-defined number of cycles of the reference clock CLK. For example, when a counter value obtained by counting the number of cycles of the reference clock CLK reaches the pre-defined number, the detection signal SR_RESET is set to the logic high level (i.e., SR_RESET=1).

In the embodiment shown in FIG. 1, the target peak current value Isen_vref is selected from only two candidate peak current values Iset_Vlarge and Iset_Vsmall. However, this is for illustrative purposes only, and is not meant to be a limitation of the present invention. Alternatively, the target peak current value Isen_vref may be selected from more than two candidate peak current values.

Figure 8:
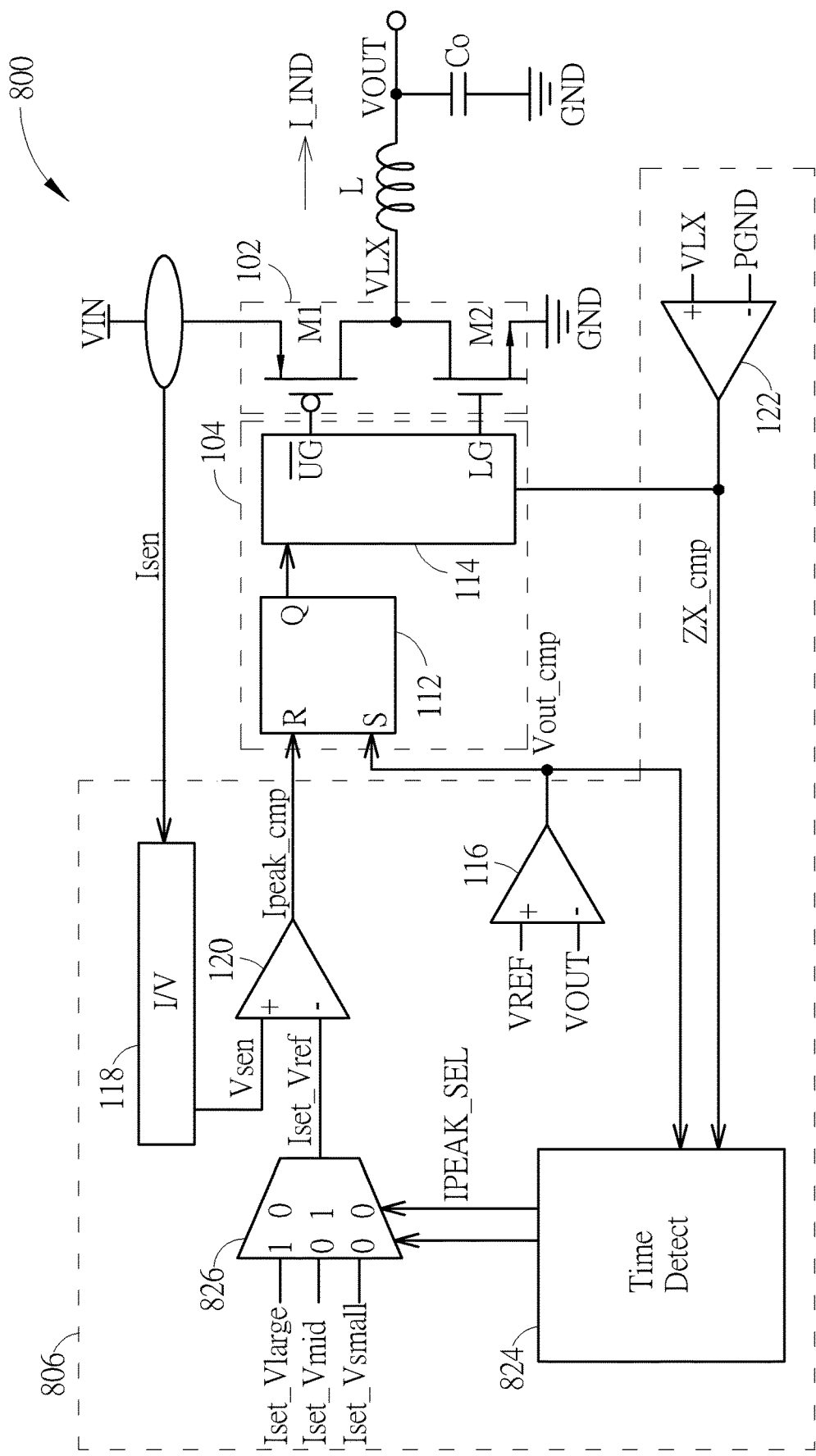
FIG. 8 is a diagram illustrating a second PFM converter according to an embodiment of the present invention.

FIG. 8 is a diagram illustrating a second PFM converter according to an embodiment of the present invention. The major difference between the PFM converters 100 and 800 are a detection circuit (labeled by "Time Detect") 824 and a multiplexer circuit 826 included in a feedback control circuit 806. The multiplexer circuit 826 is arranged to receive a plurality of candidate peak current values Iset_Vlarge, Iset_Vmid, and Iset_Vsmall, and output one of the candidate peak current values Iset_Vlarge, Iset_Vmid, and Iset_Vsmall as the target peak current value Iset_vref according to the selection control signal IPEAK_SEL. For example, when the selection control signal IPEAK_SEL is set by a binary code "10" (i.e., IPEAK_SEL=10), the multiplexing operation performed at the multiplexer circuit 826 outputs the candidate peak current value Iset_Vlarge as the target peak current value Iset_vref (i.e., Iset_vref=Iset_Vlarge); when the selection control signal IPEAK_SEL is set by a binary code "01" (i.e., IPEAK_SEL=01), the multiplexing operation performed at the multiplexer circuit 826 outputs the candidate peak current value Iset_Vmid as the target peak current value Iset_vref (i.e., Iset_vref=Iset_Vmid); and when the selection control signal IPEAK_SEL is set by a binary code "00" (i.e., IPEAK_SEL=00), the multiplexing operation performed at the multiplexer circuit 826 outputs the candidate peak current value Iset_Vsmall as the target peak current value Iset_vref (i.e., Iset_vref=Iset_Vsmall), where the candidate peak current value Iset_Vlarge is larger than the candidate peak current value Iset_Vmid, and the candidate peak current value Iset_Vmid is larger than the candidate peak current value Iset_Vsmall.

In this embodiment, the detection circuit 824 is arranged to adaptively adjust the selection control signal IPEAK_SEL according to a pulse interval between two successive inductor current pulses (e.g., on-time pulses) of the PFM converter 800. For example, when a pulse interval between two successive inductor current pulses (e.g., a previous inductor current pulse and a current inductor current pulse) is longer than the pre-defined interval T_setDown, the detection circuit 824 is operative to set the selection control signal IPEAK_SEL for instructing the multiplexer circuit 826 to output the candidate peak current value Iset_Vsmall as the target peak current value Iset_vref of the current inductor current pulse. For another example, when a pulse interval between two successive inductor current pulses (e.g., a previous inductor current pulse and a current inductor current pulse) is shorter than another pre-defined interval T_setUp, the detection circuit 824 is operative to set the selection control signal IPEAK_SEL for instructing the multiplexer circuit 826 to output one of the candidate peak current values Iset_Vlarge and Iset_Vmid as the target peak current value Iset_vref of the current inductor current pulse. Consider a case where a current pulse interval between two successive inductor current pulses is shorter than the pre-defined interval T_setUp and a previous/next pulse interval between two successive inductor current pulses is also shorter than the pre-defined interval T_setUp, the detection circuit 824 may instruct the multiplexer circuit 826 to output one of the candidate peak current values Iset_Vlarge and Iset_Vmid as the target peak current value Iset_vref in response to the current pulse interval detection, and output the other of the candidate peak current values Iset_Vlarge and Iset_Vmid as the target peak current value Iset_vref in response to the previous/next pulse interval detection. To put it simply, when successive pulse intervals of the PFM converter 800 are all found shorter than the pre-defined interval T_setUp, the detection circuit 824 is operative to set the selection control signal IPEAK_SEL for instructing the multiplexer circuit 826 to sequentially output different candidate peak current values (which include Iset_Vlarge and Iset_Vmid in this example) as the target peak current value Iset_vref. With the help of adaptively adjusting a peak inductor current value according to a pulse interval, the unwanted interference that interferes with an operating band of an application (e.g., an audio band of an audio application) can be prevented through using the proposed PFM converter 800. Furthermore, the proposed PFM converter 800 with an adaptive peak inductor current value can meet efficiency requirements of different applications.

Figure 9:
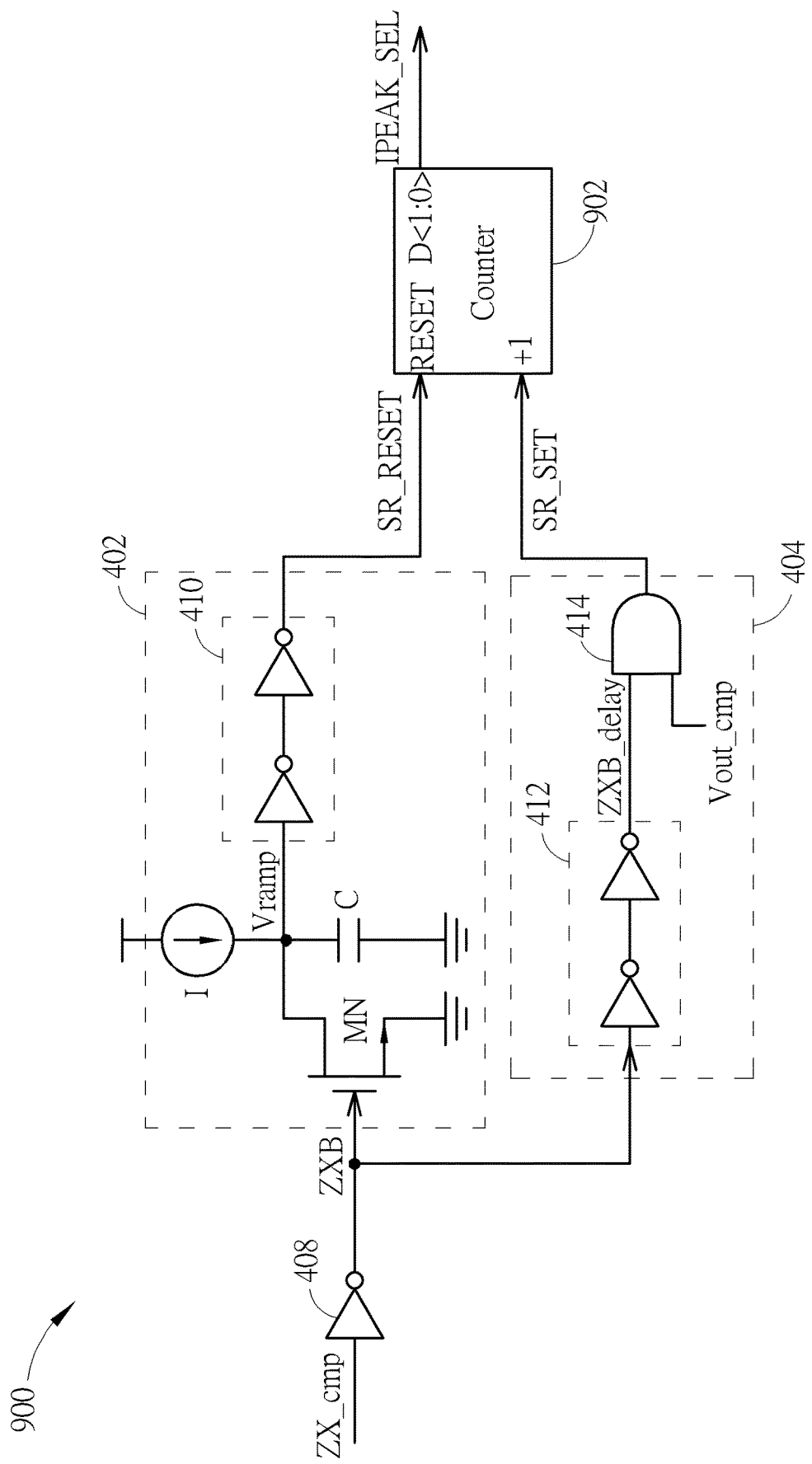
FIG. 9 is a diagram illustrating a third detection circuit design according to an embodiment of the present invention.

FIG. 9 is a diagram illustrating a third detection circuit design according to an embodiment of the present invention. The detection circuit 824 shown in FIG. 8 may be implemented by the detection circuit 900 shown in FIG. 9. The design of the detection circuit 900 is based on that of the detection circuit 400. The major difference between the detection circuits 400 and 900 is that the detection circuit 900 employs a counter circuit (labeled by "Counter") 902 that takes the place of the SR latch circuit 406. In this embodiment, the counter circuit 902 is arranged to update a counter value by an adjustment value (e.g., +1) when the detection signal SR_SET has a transition from the logic low level (i.e., SR_SET=0) to the logic high level (i.e., SR_SET=1) due to a pulse interval between two successive inductor current pulses being found shorter than the pre-defined interval T_setUp, and is further arranged to output the selection control signal IPEAK_SEL according to the counter value. The detection signal SR_RESET acts as a reset signal of the counter circuit 902. Hence, when the detection signal SR_RESET has a transition from the logic low level (i.e., SR_RESET=0) to the logic high level (i.e., SR_RESET=1) due to a pulse interval between two successive inductor current pulses being found longer than the pre-defined interval T_setDown, the counter value is reset to an initial binary code (e.g., 00) for selection of the smallest candidate peak current value.

The processing circuit 902 shown in FIG. 9 employs analog means to detect if a pulse interval between two successive inductor current pulses is longer than the pre-defined interval T_setDown. However, this is for illustrative purposes only, and is not meant to be a limitation of the present invention. Alternatively, digital means may be employed to achieve the same objective of detecting if a pulse interval between two successive inductor current pulses is longer than the pre-defined interval T_setDown.

Figure 10:
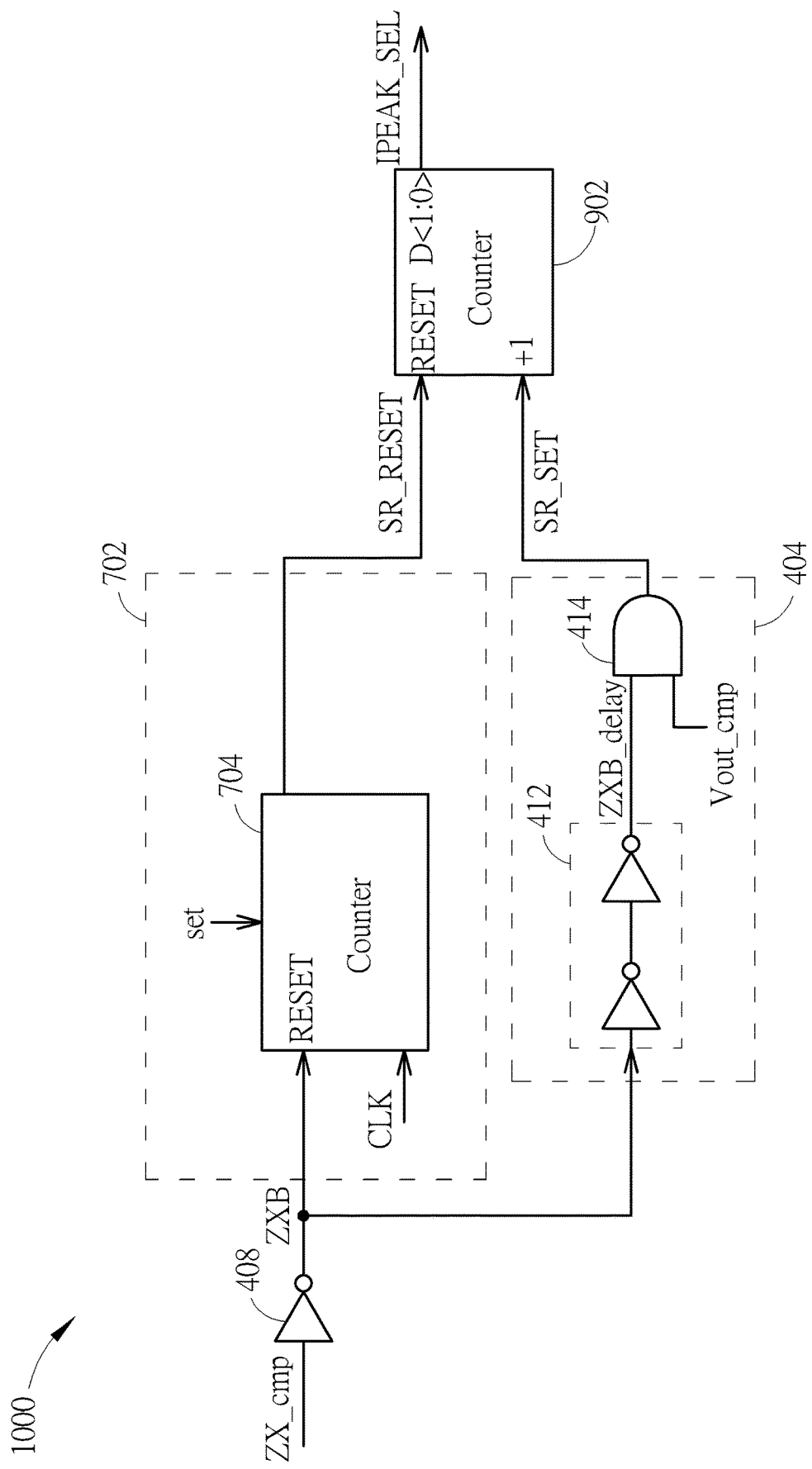
FIG. 10 is a diagram illustrating a fourth detection circuit design according to an embodiment of the present invention.

FIG. 10 is a diagram illustrating a fourth detection circuit design according to an embodiment of the present invention. The detection circuit 824 shown in FIG. 8 may be implemented by the detection circuit 1000 shown in FIG. 10. The major difference between the detection circuits 900 and 1000 is that the detection circuit 1000 includes the processing circuit 702 that takes the place of the processing circuit 402 shown in FIG. 9. To put it another way, the design of the detection circuit 1000 is based on that of the detection circuit 700, where the major difference between the detection circuits 700 and 1000 is that the detection circuit 1000 employs the counter circuit 902 that takes the place of the SR latch circuit 406. Since a person skilled in the pertinent art can readily understand details of the detection circuit 1000 after reading above paragraphs, further description is omitted here for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A feedback control circuit of a pulse-frequency modulation (PFM) converter, comprising:
   a multiplexer circuit, arranged to receive a plurality of candidate peak current values, and output one of the plurality of candidate peak current values as a target peak current value according to a selection control signal, wherein a peak current value of an inductor current pulse of the PFM converter is subject to the target peak current value; and
   a detection circuit, arranged to adaptively adjust the selection control signal according to a pulse interval between two successive inductor current pulses of the PFM converter.

2. The feedback control circuit of claim 1, wherein the plurality of candidate peak current values comprise a first candidate peak current value and a second candidate peak current value that is smaller than the first candidate peak current value; and the detection circuit is arranged to set the selection control signal for selecting the first candidate peak current value as the target peak current value when detecting that the pulse interval is shorter than a first pre-defined interval, and is further arranged to set the selection control signal for selecting the second candidate peak current value as the target peak current value when detecting that the pulse interval is longer than a second pre-defined interval that is longer than the first pre-defined interval.

3. The feedback control circuit of claim 2, wherein the plurality of candidate peak current values comprise the first candidate peak current value and the second candidate peak current value only.

4. The feedback control circuit of claim 2, wherein the plurality of candidate peak current values further comprise a third candidate peak current value that is larger than the second candidate peak current value and is different from the first candidate peak current value; and the detection circuit is further arranged to set the selection control signal for selecting the third candidate peak current value as the target peak current value when detecting that another pulse interval between two successive inductor current pulses of the PFM converter is shorter than the first pre-defined interval, and is further arranged to set the selection control signal for selecting the second candidate peak current value as the target peak current value when detecting that said another pulse interval is longer than the second pre-defined interval, where the pulse interval and said another pulse interval are successive pulse intervals of the PFM converter.

5. The feedback control circuit of claim 2, wherein the detection circuit comprises:
a first processing circuit, arranged to detect if the pulse interval is longer than the second pre-defined interval, to generate a first detection signal;
a second processing circuit, arranged to detect if the pulse interval is shorter than the first pre-defined interval, to generate a second detection signal; and
a set-reset (SR) latch circuit, having a reset input node arranged to receive the first detection signal, a set input node arranged to receive the second detection signal, and an output node arranged to output the selection control signal.

6. The feedback control circuit of claim 5, wherein the feedback control circuit further comprises:
a first comparator circuit, arranged to perform zero-crossing detection upon a voltage at a connection node between a high-side power switch and a low-side power switch of the PFM converter, to generate a first feedback control signal; and
a second comparator circuit, arranged to detect if an output voltage of the PFM converter is lower than a reference voltage, to generate a second feedback control signal;
the second processing circuit comprises:
an inverter chain, arranged to receive an input signal derived from the first feedback control signal, and apply a pre-defined delay to the input signal to generate a delayed input signal, wherein the first pre-defined interval is set based at least partly on the pre-defined delay; and
an AND gate, arranged to receive the delayed input signal and the second feedback control signal, and perform an AND operation upon the delayed input signal and the second feedback control signal to generate the second detection signal.

7. The feedback control circuit of claim 5, wherein the feedback control circuit further comprises:
a comparator circuit, arranged to perform zero-crossing detection upon a voltage at a connection node between a high-side power switch and a low-side power switch of the PFM converter, to generate a feedback control signal;
the first processing circuit comprises:
a transistor, having a gate terminal arranged to receive an input signal derived from the feedback control signal, a source terminal coupled to a first reference voltage, and a drain terminal;
a current source, coupled between a second reference voltage and the drain terminal of the transistor;
a capacitor, coupled between the drain terminal of the transistor and the first reference voltage, wherein the second pre-defined interval is set based at least partly on charging time of the capacitor; and
an inverter chain, arranged to generate the first detection signal according to a drain voltage at the drain terminal of the transistor.

8. The feedback control circuit of claim 5, wherein the feedback control circuit further comprises:
a comparator circuit, arranged to perform zero-crossing detection upon a voltage at a connection node between a high-side power switch and a low-side power switch of the PFM converter, to generate a feedback control signal;
the first processing circuit comprises:
a counter circuit, arranged to count a number of cycles of a reference clock to set the first detection signal, wherein the second pre-defined interval is set based at least partly on a pre-defined number of cycles of the reference clock, and the feedback control signal acts as a reset signal of the counter circuit.

9. The feedback control circuit of claim 2, wherein the detection circuit comprises:
a first processing circuit, arranged to detect if the pulse interval is longer than the second pre-defined interval, to generate a first detection signal;
a second processing circuit, arranged to detect if the pulse interval is shorter than the first pre-defined interval, to generate a second detection signal; and
a first counter circuit, arranged to update a counter value by an adjustment value when the second detection signal has a transition from a first logic level to a second logic level, and output the selection control signal according to the counter value, wherein the first detection signal acts as a reset signal of the first counter circuit.

10. The feedback control circuit of claim 9, wherein the feedback control circuit further comprises:
a first comparator circuit, arranged to perform zero-crossing detection upon a voltage at a connection node between a high-side power switch and a low-side power switch of the PFM converter, to generate a first feedback control signal; and
a second comparator circuit, arranged to detect if an output voltage of the PFM converter is lower than a reference voltage, to generate a second feedback control signal;
the second processing circuit comprises:
an inverter chain, arranged to receive an input signal derived from the first feedback control signal, and apply a pre-defined delay to the input signal to generate a delayed input signal, wherein the first pre-defined interval is set based at least partly on the pre-defined delay; and an AND gate, arranged to receive the delayed input signal and the second feedback control signal, and perform an AND operation upon the delayed input signal and the second feedback control signal to generate the second detection signal.

11. The feedback control circuit of claim 9, wherein the feedback control circuit further comprises:
a comparator circuit, arranged to perform zero-crossing detection upon a voltage at a connection node between a high-side power switch and a low-side power switch of the PFM converter, to generate a feedback control signal;
the first processing circuit comprises:
a transistor, having a gate terminal arranged to receive an input signal derived from the feedback control signal, a source terminal coupled to a first reference voltage, and a drain terminal;
a current source, coupled between a second reference voltage and the drain terminal of the transistor;
a capacitor, coupled between the drain terminal of the transistor and the first reference voltage, wherein the second pre-defined interval is set based at least partly on charging time of the capacitor; and
an inverter chain, arranged to generate the first detection signal according to a drain voltage at the drain terminal of the transistor.

12. The feedback control circuit of claim 9, wherein the feedback control circuit further comprises:
a comparator circuit, arranged to perform zero-crossing detection upon a voltage at a connection node between a high-side power switch and a low-side power switch of the PFM converter, to generate a feedback control signal;
the first processing circuit comprises:
a second counter circuit, arranged to count a number of cycles of a reference clock to generate the first detection signal, wherein the second pre-defined interval is set based at least partly on a pre-defined number of cycles of the reference clock, and the feedback control signal acts as a reset signal of the second counter circuit.

13. The feedback control circuit of claim 1, wherein the PFM converter is used by an audio application.

14. A feedback control method employed by a pulse-frequency modulation (PFM) converter, comprising:
performing a multiplexing operation upon a plurality of candidate peak current values according to a selection control signal, to output one of the plurality of candidate peak current values as a target peak current value, wherein a peak current value of an inductor current pulse of the PFM converter is subject to the target peak current value; and
adaptively adjusting the selection control signal according to a pulse interval between two successive inductor current pulses of the PFM converter.

15. The feedback control method of claim 14, wherein the plurality of candidate peak current values comprise a first candidate peak current value and a second candidate peak current value that is smaller than the first candidate peak current value; and adaptively adjusting the selection control signal according to the pulse interval between two successive inductor current pulses of the PFM converter comprises:
in response to detecting that the pulse interval is shorter than a first pre-defined interval, setting the selection control signal for selecting the first candidate peak current value as the target peak current value; and
in response to detecting that the pulse interval is longer than a second pre-defined interval that is longer than the first pre-defined interval, setting the selection control signal for selecting the second candidate peak current value as the target peak current value.

16. The feedback control method of claim 15, wherein the plurality of candidate peak current values comprise the first candidate peak current value and the second candidate peak current value only.

17. The feedback control method of claim 15, wherein the plurality of candidate peak current values further comprise a third candidate peak current value that is larger than the second candidate peak current value and is different from the first candidate peak current value; and the feedback control method further comprises:
in response to detecting that another pulse interval between two successive inductor current pulses of the PFM converter is shorter than the first pre-defined interval, setting the selection control signal for selecting the third candidate peak current value as the target peak current value; and
in response to detecting that said another pulse interval is longer than the second pre-defined interval, setting the selection control signal for selecting the second candidate peak current value as the target peak current value;
wherein the pulse interval and said another pulse interval are successive pulse intervals of the PFM converter.

18. The feedback control method of claim 14, wherein the PFM converter is used by an audio application.

* * * * *